United States Patent
Ganesan et al.

(10) Patent No.: US 10,924,068 B2
(45) Date of Patent: Feb. 16, 2021

(54) DIGITAL PREDISTORTION CALIBRATION

(71) Applicant: Texas Instruments Incorporated, Dallas, TX (US)

(72) Inventors: Raghu Ganesan, Bangalore (IN); Harish Kumar Ramesh, Bangalore (IN); John Roshan Samuel Chandran, Bangalore (IN); Lakshmi Bala Krishna Manoja Vinnakota, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/288,094

(22) Filed: Feb. 27, 2019

(65) Prior Publication Data
US 2020/0274500 A1    Aug. 27, 2020

(51) Int. Cl.
*H04B 17/12* (2015.01)
*H03F 1/32* (2006.01)
(Continued)

(52) U.S. Cl.
CPC .......... *H03F 1/3247* (2013.01); *H04B 17/12* (2015.01); *H04B 17/14* (2015.01); *H04B 17/24* (2015.01)

(58) Field of Classification Search
CPC .......... H01Q 11/12; H01Q 19/18; H03F 1/26; H03F 1/30; H03F 1/32; H03F 1/3247; H03F 3/16; H03F 3/19; H03F 3/24; H03F 3/38; H03L 5/00; H03L 7/06; H04B 1/04; H04B 1/40; H04B 1/62; H04B 7/00; H04B 15/00; H04B 17/12; H04B 17/14; H04B 17/24;
(Continued)

(56) References Cited

U.S. PATENT DOCUMENTS 7,136,628 B2   11/2006   Yang et al.
8,326,239 B1   12/2012   Peiris
(Continued)

FOREIGN PATENT DOCUMENTS

WO    2010/128160 A1    11/2010

OTHER PUBLICATIONS

Shoaib Amin et al, "Noise Impact on the Identification of Digital Predistorter Parameters in the Indirect Learning Architecture", 2012 Swedish Communication Technologies Workshop, Oct. 24-26, 2012, pp. 36-39.
(Continued)

*Primary Examiner* — Shawkat M Ali
(74) *Attorney, Agent, or Firm* — Charles F. Koch; Charles A. Brill; Frank D. Cimino

(57) ABSTRACT

A method for digital predistortion (DPD) calibration in a wireless communication device is provided that includes transmitting, by transmission circuitry of the wireless communication device, a plurality of pulses, where each pulse corresponds to an amplitude step in a pattern of amplitude steps, where the amplitude steps are separated by silence gaps, receiving each pulse in receiver circuitry of the wireless communication device, generating, by an accumulator component of the wireless communication device, an accumulated sample for each pulse based on a plurality of samples output by the receiver circuitry for the pulse, and computing, by a processor of the wireless communication device, amplitude dependent gain (AM/AM) and amplitude dependent phase shift (AM/PM) values for each accumulated sample.

20 Claims, 7 Drawing Sheets

(51) Int. Cl.
*H04B 17/24* (2015.01)
*H04B 17/14* (2015.01)

(58) Field of Classification Search
CPC ......... H04L 25/03; H04L 27/00; H04L 27/20; H04L 27/36
USPC ...... 330/2, 10, 136, 151, 149, 277; 375/219, 375/295–297; 455/63.1, 73, 114.3, 127.1, 455/522
See application file for complete search history.

(56) References Cited

U.S. PATENT DOCUMENTS

| | | | |
|---|---|---|---|
| 8,340,602 B1 | 12/2012 | Peiris | |
| 2005/0157814 A1 | 7/2005 | Cova et al. | |
| 2006/0232332 A1 | 10/2006 | Braithwaite | |
| 2007/0190952 A1* | 8/2007 | Waheed | H04B 1/0475 455/114.3 |
| 2008/0094139 A1* | 4/2008 | Takano | H03F 1/30 330/149 |
| 2009/0054016 A1* | 2/2009 | Waheed | H03F 1/3247 455/114.3 |
| 2011/0009153 A1* | 1/2011 | Chiba | H04B 1/0475 455/522 |
| 2017/0317686 A1* | 11/2017 | Dartois | H03F 3/24 |

OTHER PUBLICATIONS

Sweety Badhwar et al, "Design of Digital Predistortion Technique for RF Power Amplifier using Memory Polynomial", International Journal of Engineering Research and Applications, vol. 4, Issue 9 (Version 3), Sep. 2014, pp. 1-3.
Changsoo Eun and Edward J. Powers, "A New Volterra Predistorter Based on the Indirect Learning Adventure", IEEE Transactions on Signal Processing, vol. 45, No. 1, Jan. 1997, pp. 223-227.
Mohamed K. Nezami, "Fundamentals of Power Amplifier Linearization Using Digital Pre-Distortion", High Frequency Electronics, Sep. 2004, pp. 54-58.
Demetri Psaltis, et al, "A Multilayered Neural Network Controller", IEEE Control Systems Magazine, vol. 8, Issue 2, Apr. 1988, pp. 17-21.
Shawn P. Stapleton, "Presentation on Digital Predistortion of Power Amplifiers", Agilent Technologies, Inc., Jun. 2001, pp. 1-33.
Frank Zavosh et al, "Digital Predistortion Techniques for RF Power Amplifiers with CDMA Applications", Microwave Journal, Oct. 1, 1999, pp. 1-8.
Qin Zhang and Zhibin Zeng, "A New Adaptive Algorithm for Digital Predistortion Using LS with Singular Value Decomposition", Proceedings of the 2013 International Conference on Information Science and Technology Application, May 2013, pp. 169-172.
Dayong Zhou and Victor E. Debrunner, "Novel Adaptive Nonlinear Predistorters Based on the Direct Learning Algorithm", IEEE Transactions on Signal Processing, vol. 55, No. 1, Jan. 2007, pp. 120-133.
International Search Report for PCT/US2020/019865 dated May 28, 2020.
"CC3220 SimpleLink Wi-Fi Wireless and Internet-of-Things Solution, a Single-Chip Wireless MCU", SWAS035A, Texas Instruments, Inc., Sep. 2016, revised Feb. 2017, pp. 1-88.

* cited by examiner

DIGITAL PREDISTORTION CALIBRATION

BACKGROUND

Wireless sensor networks are typically implemented using low power single chip devices operating on AA batteries, e.g., wireless communication devices. Such devices include a Wi-Fi radio with an integrated radio frequency (RF) power amplifier (PA). The RF PA is an active component creating high power levels and needs to operate with high efficiency to help conserve power. However, highly efficient operation of a PA when using amplitude modulated signals typically results in nonlinear distortions that degrade the performance of the network. For this reason, regulatory requirements limit the amount of distortion that is tolerable, commonly in the form of limits on the power emitted in neighboring frequency channels. In view of these requirements, improving PA linearity and reducing distortions is important.

One technique that can be used to improve PA linearity is digital predistortion (DPD) of the PA based on calibration parameters. The DPD may be performed when the device is powered on and may be performed at other times as well. Current techniques for DPD calibration may be too time consuming and/or consume too much power to be used in battery operated devices.

SUMMARY

Embodiments of the present disclosure relate to methods and apparatus for digital predistortion (DPD) calibration. In one aspect, a method for DPD calibration in a wireless communication device is provided that includes transmitting, by transmission circuitry of the wireless communication device, a plurality of pulses, where each pulse corresponds to an amplitude step in a pattern of amplitude steps, where the amplitude steps are separated by silence gaps, receiving each pulse in receiver circuitry of the wireless communication device, generating, by an accumulator component of the wireless communication device, an accumulated sample for each pulse based on a plurality of samples output by the receiver circuitry for the pulse, and computing by a processor of the wireless communication device, amplitude dependent gain (AM/AM) and amplitude dependent phase shift (AM/PM) values for each accumulated sample.

In one aspect, a wireless communication device is provided that includes transmission circuitry, receiver circuitry coupled to the transmission circuitry by a feedback loop to receive pulses transmitted by the transmission circuitry, an accumulator component coupled the receiver circuitry to receive samples output by the receiver circuitry, a processor coupled to the transmission circuitry and to the accumulator component, and a non-transitory computer readable storage medium storing a program for digital predistortion (DPD) calibration for execution by the processor, the program including instructions to transmit, by the transmission circuitry, a plurality of pulses, where each pulse corresponds to an amplitude step in a pattern of amplitude steps, where the amplitude steps are separated by silence gaps, receive each pulse in the receiver circuitry via the feedback loop, generate, by the accumulator component, an accumulated sample for each pulse based on a plurality of samples output by the receiver circuitry for the pulse, and compute amplitude dependent gain (AM/AM) and amplitude dependent phase shift (AM/PM) values for each accumulated sample.

DETAILED DESCRIPTION

Figure 1:
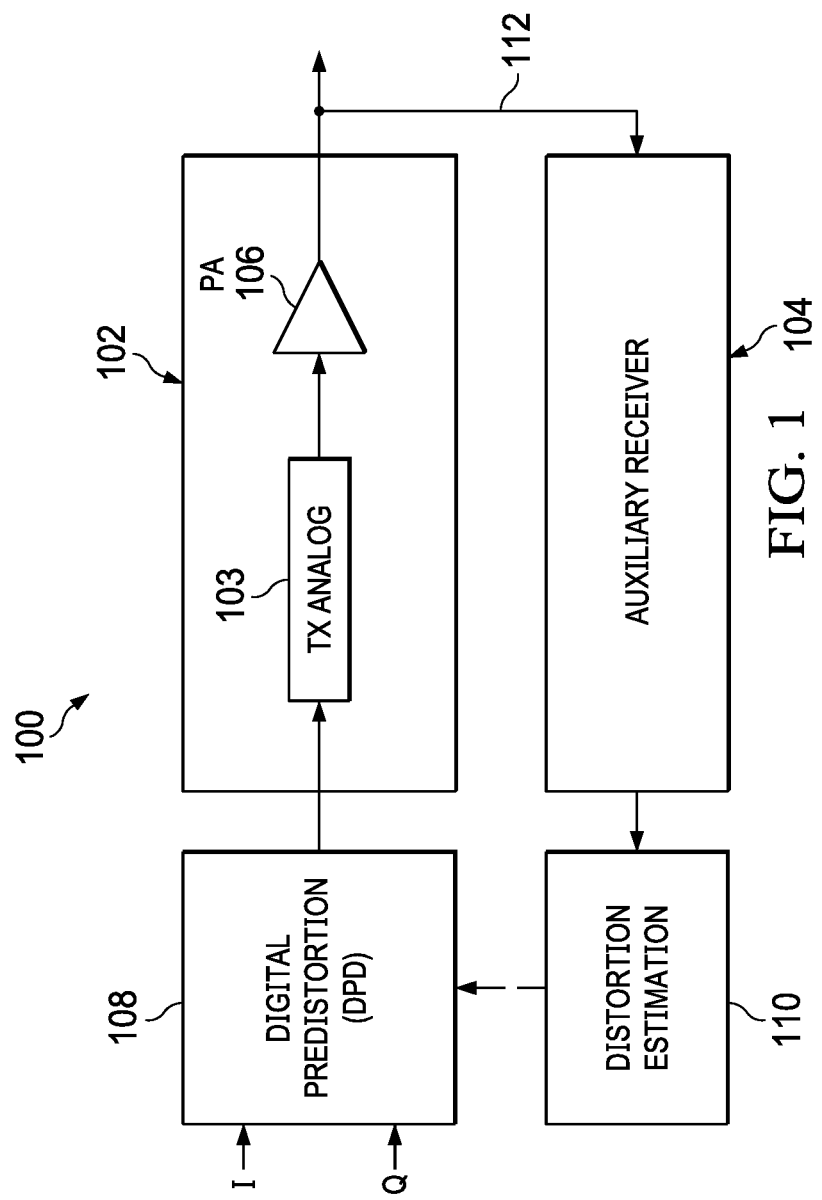
FIG. 1 is a block diagram of an example 5 GHz band wireless local area network (WLAN) radio including circuitry for digital predistortion (DPD) and DPD calibration that can be used in a battery operated wireless communication device.

Specific embodiments of the disclosure will now be described in detail with reference to the accompanying figures. Like elements in the various figures are denoted by like reference numerals for consistency.

Embodiments of the disclosure provide for calibration of a digital predistortion (DPD) component in a Wi-Fi radio. The nonlinear characteristics of a radio frequency (RF) power amplifier (PA) are characterized by the amplitude dependent gain (amplitude modulation (AM)/AM or AM2AM) and amplitude dependent phase shift (AM/phase modulation (PM) or AM2PM) of the PA. The essence of digital predistortion is that the amplitude and phase of input signals are preprocessed to compensate for the AM/AM and AM/PM distortion caused by the PA.

FIG. 1 is a block diagram of an example 5 GHz band wireless local area network (WLAN) radio 100 including circuitry for digital predistortion (DPD) and DPD calibration that can be used in a battery operated wireless communication device. The example radio 100 includes transmission circuitry 102 that includes transmission (TX) analog circuitry 103 and a power amplifier (PA) 106 coupled to the TX analog circuitry 103. The TX analog circuitry 103 includes circuitry to prepare signals to be transmitted for amplification by the PA 106. The example radio 100 also include auxiliary receiver circuitry 104 coupled to the transmission circuitry 102 by a feedback loop 112 for use in determining DPD calibration parameters for the PA 106. The inputs to the radio 100 are the in-band (I) and quadrature (Q) components of an RF signal to be transmitted.

For efficiency in terms of power consumed and power delivered, the PA 106 should be operated near its saturation point (PSAT). However, operating a PA near PSAT introduces nonlinear distortions at the output of the PA and degrades the bit error rate (BER) performance. To compensate for AM/AM and AM/PM distortion caused by the PA 106 when operated near PSAT, the I and Q signals are pre-distorted by the DPD component 108. The DPD component 108 includes a complex gain adjuster that controls the amplitude and phase of the input signal. The amount of predistortion is controlled by entries in a calibration lookup table that interpolate the AM/AM and AM/PM nonlinearities of the PA 106. Put another way, the amount of predistortion is controlled by correction values for the AM/AM and AM/PM nonlinearities of the PA 106 stored in the calibration lookup table. The level of the envelope of the input signal is used to index the calibration lookup table. The complex gain adjuster, given correction values from entries in the calibration lookup table, provides inverse nonlinear characteristics to that of the PA 106.

The correction values of the entries in the lookup table are determined by a calibration process performed using the auxiliary receiver circuitry 104 to characterize the PA 106. The calibration is performed when the radio 100 is powered on. The calibration may also be performed during operation of the radio 100, e.g., periodically to accommodate changes in characteristics of the PA 106 due to factors such as temperature change, voltage variations, channel changes, and aging.

Figure 2:
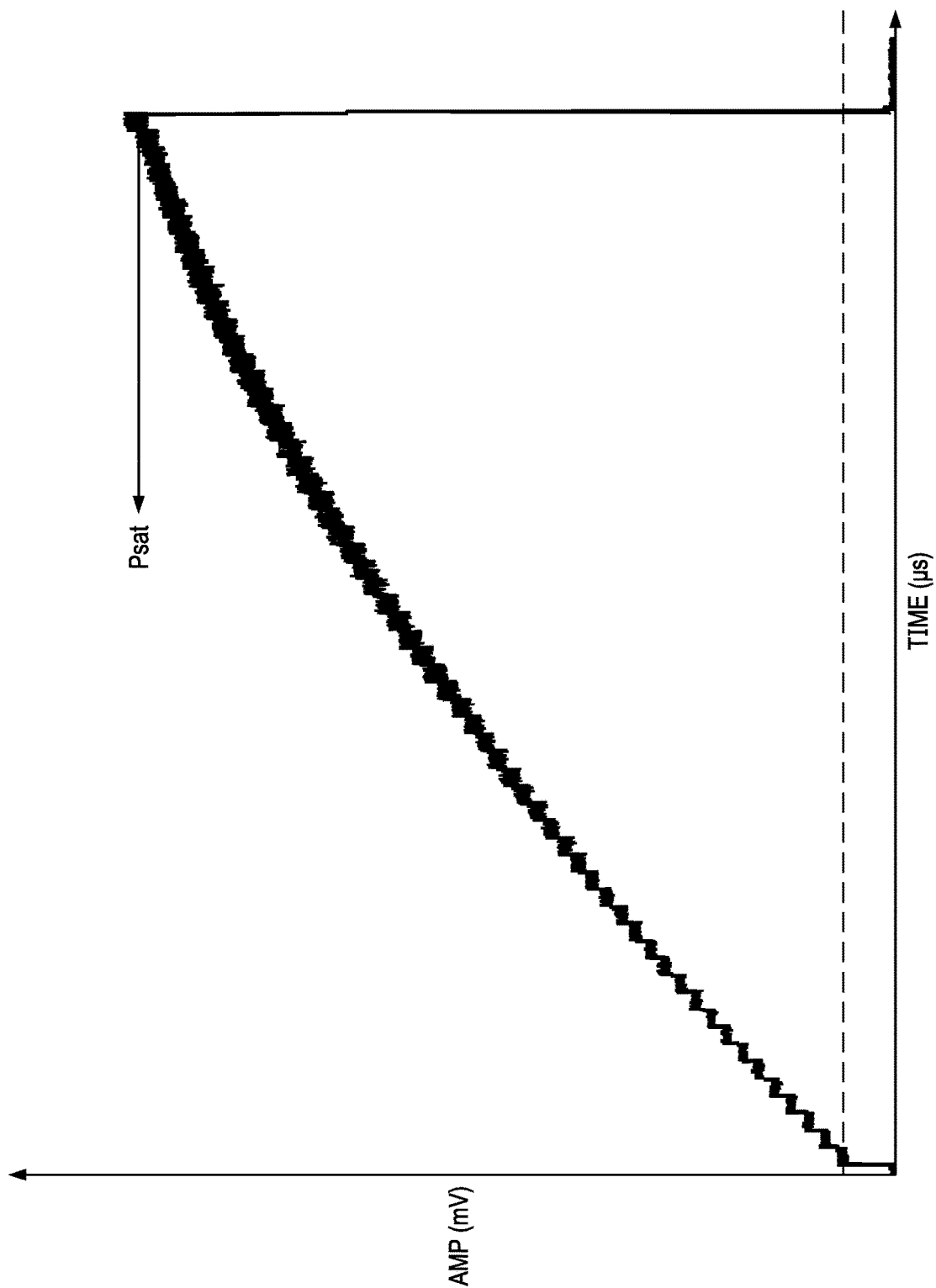
FIG. 2 is a graph illustrating an amplitude ramp for DPD calibration.

In one approach to calibration, a continuous wave (CW) tone with continuous ramping amplitude is transmitted by the transmission circuitry 102 and fed back from the output of the PA 106 to the input of the auxiliary receiver circuitry 104 via the feedback loop 112. The number of amplitude steps in the continuous ramp can be determined based on the characteristics of the PA 106. The graph of FIG. 2 illustrates an example of such an amplitude ramp. The distortion estimation component 110 receives the digital signals output by the auxiliary receiver circuitry 104 at each step and estimates the AM/AM and AM/PM values representing the distortion introduced by the PA at the corresponding amplitude. The estimated AM/AM and AM/PM values for the amplitude steps are then used to determine the correction entries of the calibration lookup table used by the DPD component 108.

Values for AM/AM and AM/PM are estimated for each step in the continuous ramp as follows. At each amplitude step, several samples of a complex CW tone are transmitted at that amplitude and received in the auxiliary receiver circuitry 104. An accumulated sample for the amplitude is generated based on the samples output by the auxiliary receiver circuitry 104. In general, the output samples are down converted to baseband and, after a specified number of samples has been output by the auxiliary receiver circuitry 104 and down converted, a filter is applied to the down converted samples to generate the accumulated sample. The magnitude and angle of the accumulated sample indicate AM/AM and AM/PM, respectively, for the step.

For example, to down convert an output sample to baseband, the output sample can be delay matched with the corresponding sample input to the transmission circuitry 102 and then multiplied with the complex conjugate of the corresponding input sample. And, to generate the accumulated sample, an averaging filter can be applied to the down converted samples.

Using a CW tone with a continuous ramp involves continuously increasing current which can cause a power management failure when the batteries of the wireless communication device cannot supply the needed current. For example, under high current demand, the battery voltage can dip below the safety margin of voltage sensors in the device, causing the device to shut down. In some embodiments, rather than transmitting a continuous CW tone with multiple increasing amplitude steps, a pattern of amplitude steps separated by silence gaps is transmitted. This pattern may be referred to as a transmission pattern herein. Breaking the ramping continuous tone with silence gaps avoids the continuous current surge from the battery and allows the bypass capacitor of the battery to recharge and supply current for the next amplitude step while avoiding a dip in the battery voltage.

When DPD calibration is performed, network traffic may be interrupted for the duration of the calibration. Adding silence gaps between amplitude steps can unacceptably increase the amount of time needed for calibration, requiring a tradeoff between the number of amplitude steps, the pulse width, also referred to as the number of samples in the pulse, of each step, and the silence gap lengths between amplitude steps. For example, assuming sixty-four amplitude steps, a pulse width of approximately 2 us, and a silence gap length of approximately 10 us, the calibration time would be greater than 750 us.

The pulse widths and amplitudes of the amplitude steps, the pattern or amplitude ordering of the amplitude steps, the number of samples per pulse, and the silence gap lengths can be determined empirically. To determine the transmission pattern of the amplitude steps, the pulse width and amplitude of each amplitude step, the samples per pulse, and the silence gap lengths, three metrics can be considered: transmission performance, calibration time, and power consumption. On the performance side, two metrics are considered: error vector magnitude (EVM) and spectral mask. The goal is to find optimal pulse widths and silence gap lengths, and a transmission pattern that reduce battery current consumption while minimizing calibration time and not violating EVM and spectral mask metrics.

Figure 3:
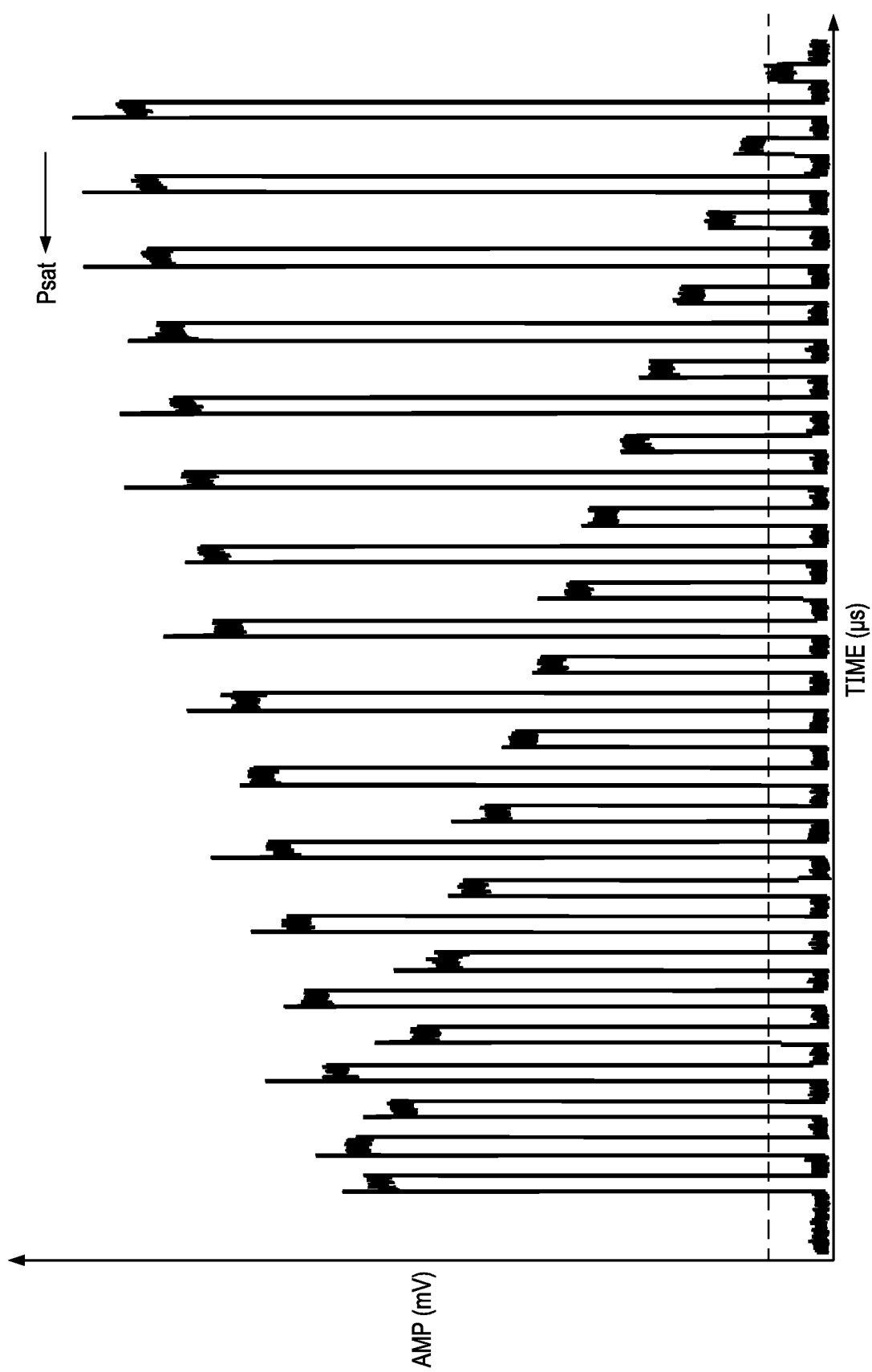
FIG. 3 is graph of an example pattern of interlaced high and low amplitude steps with silence gaps for DPD calibration.

In some embodiments, the transmission pattern of the amplitude steps and silence gaps is one in which each amplitude step increases in amplitude from the previous amplitude step. While this pattern may increase current demand for the continuously increasing amplitudes of pulses, the current demand may not be an issue provided the silence gap lengths between the amplitude steps are sufficiently long to allow the bypass capacitor of the battery to recharge. However, using sufficiently long silence gap lengths can unacceptably increase the time needed for calibration. In some embodiments, the transmission pattern is one in which high and low amplitude steps are interlaced, i.e., alternated, with silence gaps between the amplitude steps. The interlacing reduces the silence gap length needed for recovery, thus reducing the calibration time for the same number of amplitude steps. FIG. 3 is a graph of an example of one pattern of interlaced high and low amplitude steps with silence gaps between amplitude steps.

In some embodiments, the number of amplitude steps in the transmission pattern is equal to the number of entries in the calibration lookup table. However, the slow varying nature of AM/AM curves can be exploited to further reduce the number of transmitted amplitude steps for calibration, thus reducing the calibration time. In some embodiments, in order to reduce the time needed for calibration, the number of amplitude steps transmitted is less than the number of calibration lookup table entries, e.g., seven amplitude steps as compared to thirty-two table entries, and other AM/AM and AM/PM values needed to determine the correction values for the calibration lookup table entries are interpolated from the AM/AM and AM/PM values computed for the accumulated samples of the smaller number of amplitude steps.

Figure 4:
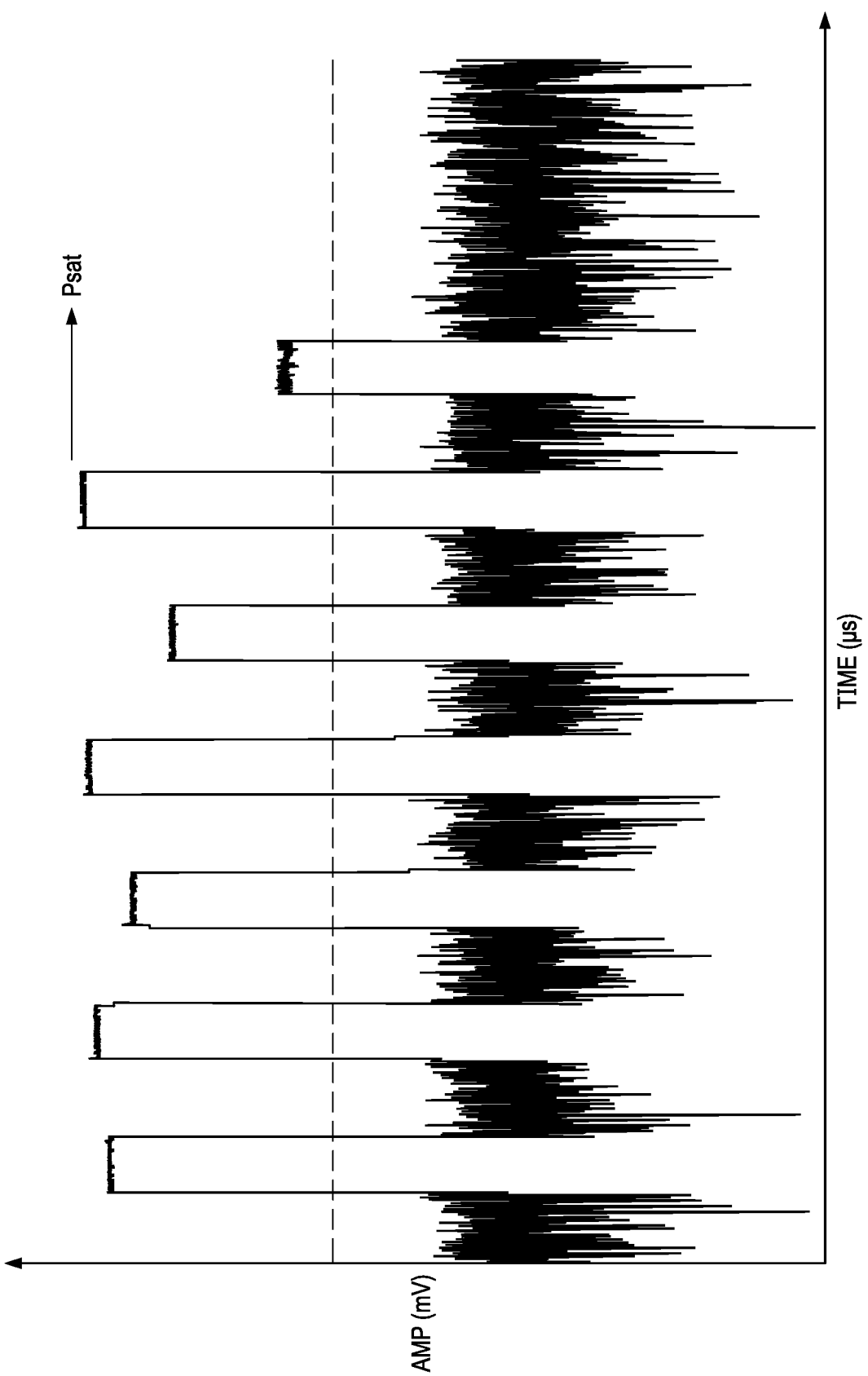
FIG. 4 is a graph of an example pattern of seven interlaced high and low amplitude steps with silence gaps between amplitude steps for DPD calibration.

For example, if the calibration lookup table has thirty-two entries and the transmission pattern is seven amplitude steps at selected amplitudes represented in the lookup table, the AM/AM and AM/PM values used to determine the other twenty-five table entries are interpolated from the AM/AM and AM/PM values computed for the seven accumulated samples of the seven amplitude steps. In such embodiments, the number and amplitudes of the amplitude steps can be determined empirically along with the pulse widths, silence gap lengths, and transmission pattern. FIG. 4 is a graph of an example of a transmission pattern of seven interlaced high and low amplitude steps with silence gaps between amplitude steps.

Figure 5:
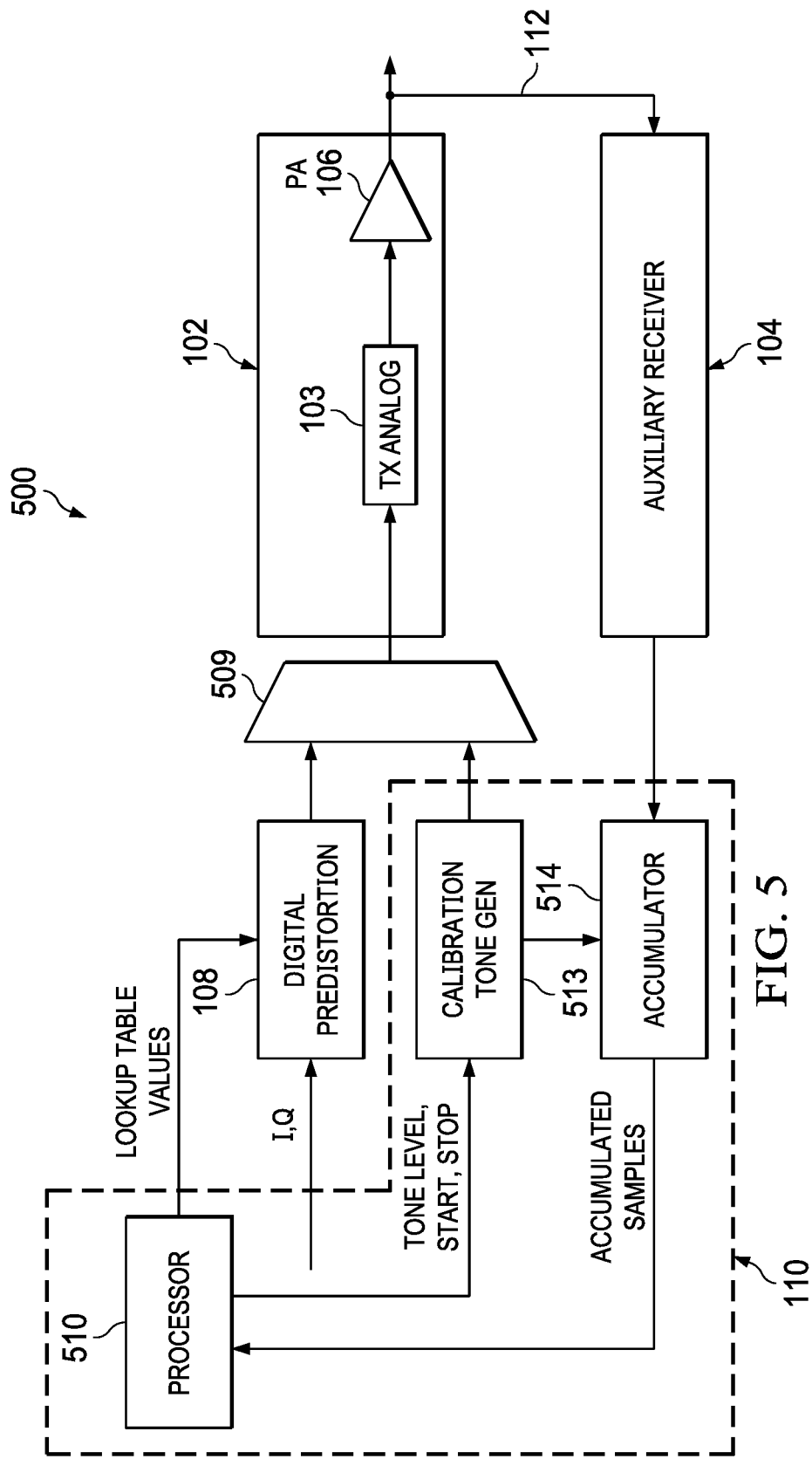
FIG. 5 is a block diagram of an example WLAN radio showing additional detail of the distortion estimation component of the WLAN radio of FIG. 1.

FIG. 5 is a block diagram of an example WLAN radio 500 showing additional detail of the distortion estimation component 110 of FIG. 1. The distortion estimation component 110 includes a calibration tone generator 513, a processor 510, and an accumulator component 514. The DPD calibration process is controlled by calibration software executing on the processor 510. The processor 510 includes one or more suitable processors such as programmable general-purpose or special-purpose microprocessors, digital signal processors (DSPs), application specific integrated circuits (ASICs), programmable controllers, programmable logic devices (PLDs), or the like, or a combination of such devices. The software instructions to perform the calibration process in the radio 100 to generate the entries in the calibration lookup table of the DPD component 108 are stored in a non-transitory computer readable storage medium (not shown) such as random access memory (RAM), read-only memory (ROM), and flash memory.

The multiplexer 509 selects between the input I and Q signals and the signals from the calibration tone generator 513 based on a control signal set by the processor 510. The calibration tone generator 513 includes programmable circuitry to generate tones (pulses) of configurable duration and amplitude.

The accumulator component 514 includes programmable circuitry to down convert and accumulate a specified number of samples of a transmitted pulse output from the auxiliary receiver circuitry 104. The accumulator component 514 further includes circuitry to filter the down converted samples to generate an accumulated sample for a transmitted pulse and provide the accumulated sample to the processor 510.

In some embodiments, additional reduction in current consumption is achieved by disabling one quadrature channel of the auxiliary receiver circuitry 104 during DPD calibration. Either quadrature channel can be disabled which can result in a reduction in current consumption of approximately 50% when processing received signals. When only one quadrature channel is used, the level of the image tone and the original tone are equal. The accumulator component 514 is designed to cancel the frequencies of the image tone because if the level of the image tone is high, the quality of the original signal can be negatively impacted.

In such embodiments, the transmitted tone frequency and the number of samples accumulated per amplitude step are chosen such that nulls in the frequency response of the filter used by the accumulator component 514 are multiples of the tone frequency, thus cancelling the image tone. Further, the frequency of the digital clock affects the choice of tone frequency and the number of samples to be accumulated. For example, assume the clock frequency is 80 MHz and the number of samples is 64. The lowest possible frequency that can be resolved given these assumptions is 80e6/64=1.25 MHz. Finer frequency resolutions can be achieved by accumulating more samples.

Figure 6:
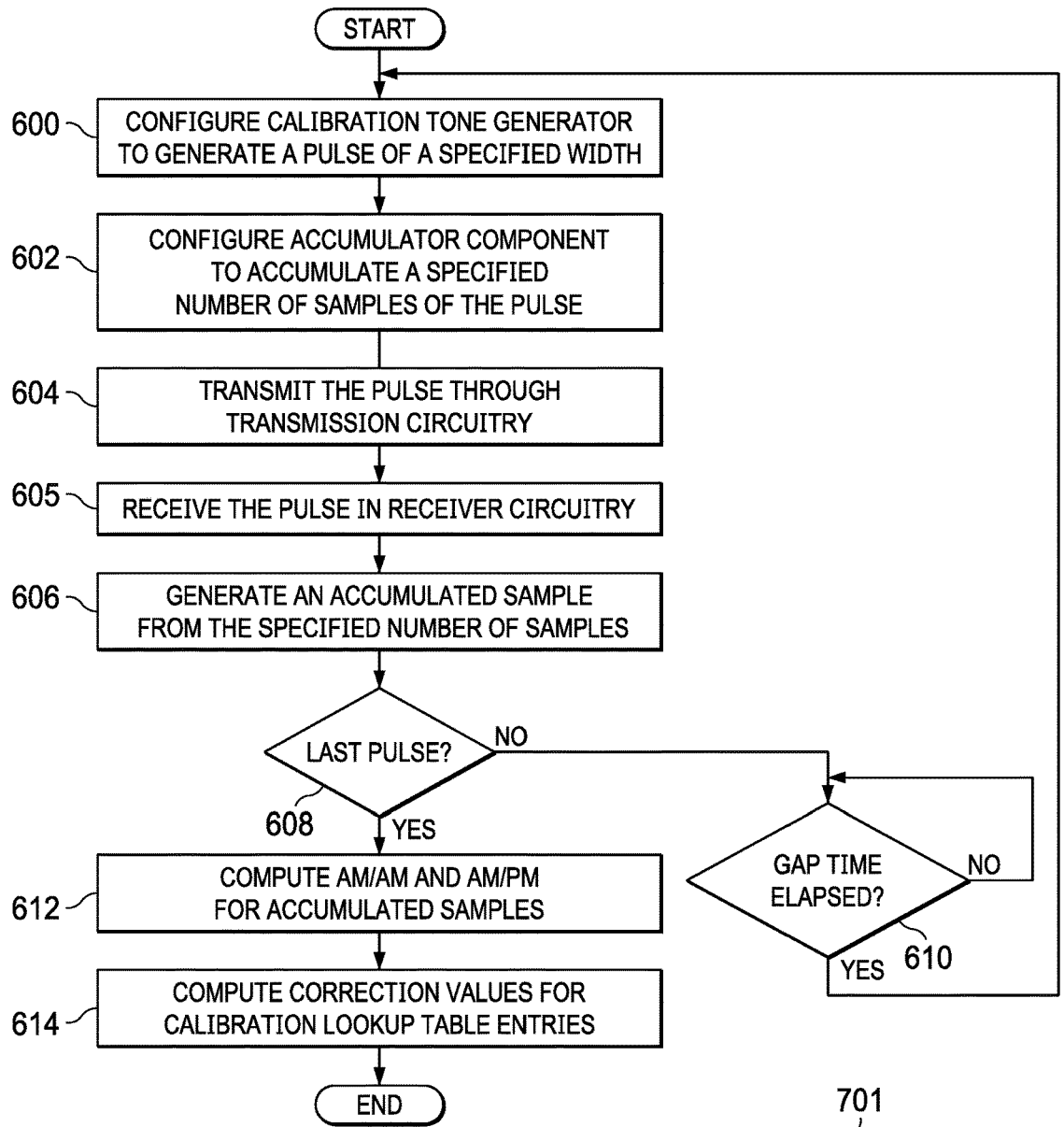
FIG. 6 is a flow diagram of a method for DPD calibration.

FIG. 6 is a flow diagram of a method for DPD calibration that can be performed by the WLAN radio 100 of FIG. 1 and the WLAN radio 500 FIG. 5. The method assumes a predetermined transmission pattern of amplitude steps in which the pulse width, amplitude, silence gap length, and number of samples to accumulate is specified for each step. In some embodiments, the widths of the pulses are identical, the silence gap lengths are identical, and the number of samples to accumulate are identical for each step of the transmission pattern. In some embodiments, the pulse width, silence gap length, and/or number of samples to accumulate can differ from step to step in the transmission pattern. In some embodiments, the transmission pattern is one in which high and low amplitude steps are interlaced, i.e., alternated. In some embodiments, one channel of the auxiliary receiver circuitry 104 is disabled.

For each pulse in the transmission pattern, the calibration software executing on the processor 510 configures 600 the calibration tone generator 513 to generate a pulse of the specified width and amplitude, and also configures 602 the accumulator component 514 to accumulate the specified number of samples of the pulse. The samples of the pulse are transmitted 604 through the transmission circuitry 102 and received 605 in the auxiliary receiver circuitry 104 via the feedback loop 112.

The accumulator component 514 receives the samples output by the auxiliary receiver circuitry 104 and generates 606 an accumulated sample from the specified number of samples. Generation of an accumulated sample includes down converting each output sample to baseband, and, after the specified number of samples has been received, filtering the samples to determine the accumulated sample. In some embodiments, an averaging filter is used to determine the accumulated sample. The accumulated sample is then provided to the processor 510.

If the pulse is not the last pulse 608 of the transmission pattern, the calibration software waits 610 until the specified silence gap length has elapsed, and then repeats steps 600-606 for the next pulse in the transmission pattern. Once the last pulse 608 has been transmitted, the calibration software computes 612 the AM/AM and AM/PM values for each of the accumulated samples, and computes 614 the correction values for the calibration lookup table entries based on the AM/AM and AM/PM values of the accumulated samples. The correction values are stored in corresponding calibration lookup table locations and used by the DPD component 108 during normal operation of the WLAN radio 100. In some embodiments, the transmission pattern includes fewer transmitted amplitude steps than are needed to determine the calibration lookup table entries. In such embodiments, the additional AM/AM and AM/PM values are interpolated from the AM/AM and AM/PM values computed for the accumulated samples resulting from the transmission pattern.

Figure 7:
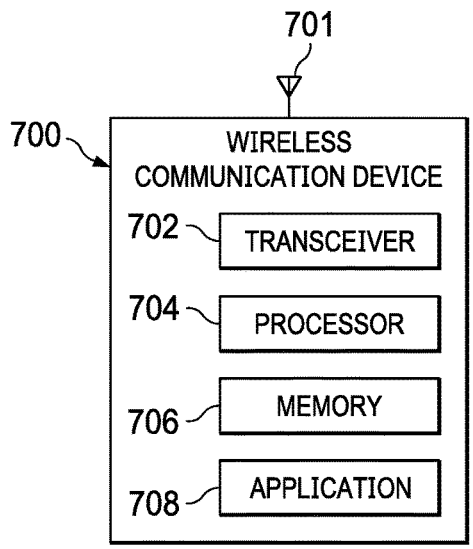
FIG. 7 is a block diagram of an example wireless communication device.

FIG. 7 is a simplified block diagram of an example wireless communication device 700. The wireless communication device 700 includes an antenna 701, a transceiver component 702, a processor component 704, a memory component 706, and an application component 708. The antenna 701 is configured to receive and transmit radio frequency (RF) signals. The transceiver component 702 is configured to modulate received RF signals and to modulate RF signals to be transmitted. The transceiver component 702 is further configured to perform DPD and DPD calibration as described herein. For example, the transceiver component 702 can include circuitry for DPD and DPD calibration such as that of FIG. 1 and FIG. 5. The memory component 706 may include any suitable memory such as random access memory (RAM), read-only memory (ROM), flash memory, or the like, or a combination of such memory. The memory component 706 may be a non-transitory computer readable storage medium storing a program for execution by the processor component 704. The application component 708 is configured to perform the function of the wireless communication device 700, e.g., controlling an alarm, controlling a light, temperature sensing, etc.

The processor component 704 includes one or more suitable processors such as programmable general-purpose or special-purpose microprocessors, digital signal processors (DSPs), application specific integrated circuits (ASICs), programmable controllers, programmable logic devices (PLDs), or the like, or a combination of such devices.

Figure 8:
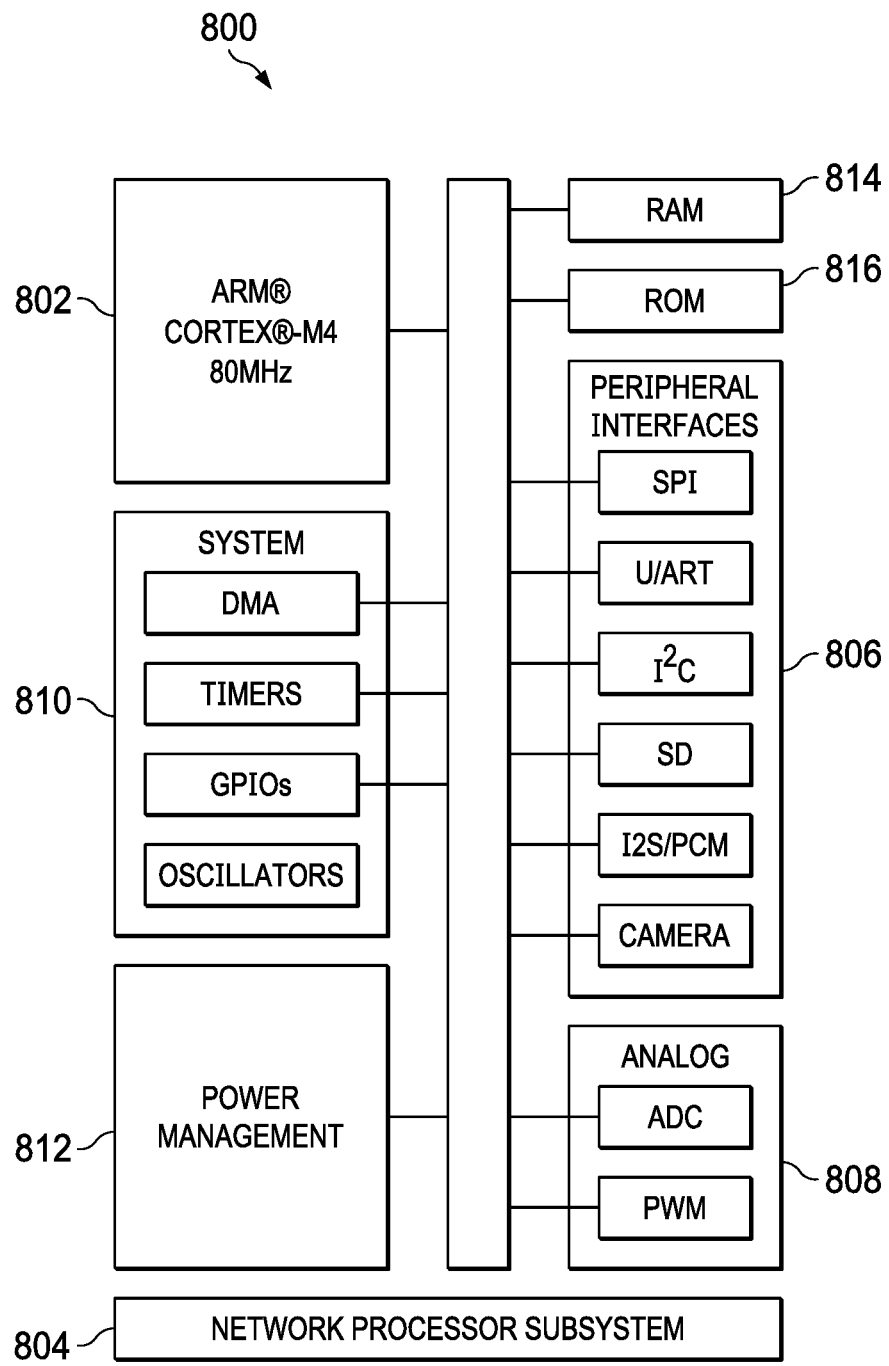
FIG. 8 is a block diagram of an example wireless sensor device.

FIG. 8 is a simplified block diagram of an example system-on-chip (SOC) 800, e.g., a wireless communication device, configurable to perform DPD calibration as described herein. The example SOC 800 depicted is a CC3220x SimpleLink™ Wi-Fi® Wireless Microcontroller Unit (MCU) System-on-Chip (SOC) available from Texas Instruments which can include support for DPD calibration as described herein. A brief description of the CC3220 is provided herein. A detailed description of the CC3220x is provided in Texas Instruments publication SWAS035A, "CC3220 SimpleLink™ Wi-Fi® Wireless and Internet-of-Things Solution, a Single-Chip Wireless MCU," September 2016, revised February 2017, which is incorporated by reference herein in its entirety.

The SOC 800 provides two execution environments, a user application environment implemented by the application MCU subsystem 802 and a network environment to execute Wi-Fi and Internet logical layers implemented by the network processor subsystem 804. The applications MCU subsystem 802 incorporates an ARM® Cortex®-M4 MCU as the main processor with embedded random access memory (RAM) and optional integrated flash memory. The network processor subsystem 804 incorporates a WI-FI Internet-on-a-chip™ dedicated ARM MCU and Wi-Fi transceiver circuitry. In some embodiments, the Wi-Fi transceiver circuitry includes circuitry for DPD and DPD calibration such as that of FIG. 1 and FIG. 5.

The SOC 800 also incorporates RAM 814 that can be used for both storage of application data and execution of application code, and a ROM 816. The SOC 800 further incorporates peripheral interfaces 806 such as a camera interface and interfaces for serial peripheral interface (SPI), inter-integrated circuit (I²C), secure digital (SD) memory, inter-IC sound (I2S), and universal asynchronous receiver-transmitter (UART) protocols. Analog interfaces 808 in the SOC 800 include analog-to-digital converters (ADC) and pulse width modulation (PWM). The SOC 800 also includes a power management subsystem 812 and system support circuitry 810 such as oscillators, general purpose input/output (GPIO) pins, timers, and internal direct memory access (DMA).

Software instructions implementing DPD calibration as described herein can be stored in a computer readable medium on the SOC 800 such as the random access memory (RAM) 814, or the read-only memory (ROM) 816, or the ROM in the network processor subsystem 804 and executed by a processor in the network processor subsystem 804.

OTHER EMBODIMENTS

While the disclosure has been described with respect to a limited number of embodiments, those having benefit of this disclosure will appreciate that other embodiments can be devised which do not depart from the scope of the disclosure as disclosed herein.

Embodiments are described herein in which some functionality of the DPD calibration is performed by a processor executing software instructions. In other embodiments, some or all of this functionality can be performed in a hardware accelerator.

Embodiments are described herein in which an averaging filter is applied to generate the accumulated sample. Other suitable filters can also be used.

In some embodiments, the silence gap lengths between the pulses have differing lengths to avoid transmission of periodic pulses that can be detected as radar signals. For example, each differing gap length can be chosen randomly or can be set in the transmission pattern.

Embodiments are described herein referring to a single calibration lookup table. In some embodiments, there are separate calibration tables for AM/AM correction values and AM/PM correction values. In some embodiments, there are multiple AM/AM and AM/PM calibration lookup tables corresponding to different gain settings of the transmission circuitry.

Embodiments are described herein in which each step of a transmission pattern has a different amplitude. In other embodiments, some amplitude steps may have the identical amplitude. For example, smaller pulse widths can be used for high amplitude steps because such amplitude steps have high SNR. However, lower amplitude steps have lower SNR and the pulse widths need to be larger to achieve more accurate filtering results. To reduce current consumption for lower amplitudes that need larger pulse widths, multiple amplitude steps of a smaller pulse width with the identical amplitude can be transmitted with silence gaps between rather than transmitting the single large pulse.

It is therefore contemplated that the appended claims will cover any such modifications of the embodiments as fall within the true scope of the disclosure.

What is claimed is:

1. A method for digital predistortion (DPD) calibration in a wireless communication device, the method comprising:
    transmitting, by transmission circuitry of the wireless communication device, a plurality of pulses, wherein each particular pulse of the plurality of pulses to an amplitude step in an interlaced pattern of alternating higher and lower amplitude steps separated by silence gaps, wherein each of the alternating higher amplitude steps is higher than a previous higher amplitude step and each of the alternating lower amplitude steps is lower than a previous lower amplitude step, and wherein at least one silence gap of the silence gaps separates each of the alternating higher and lower amplitude steps;
    receiving each particular pulse in receiver circuitry of the wireless communication device;
    generating, by an accumulator component of the wireless communication device, an accumulated sample for each particular pulse based on a plurality of samples output by the receiver circuitry for the particular pulse; and
    computing, by a processor of the wireless communication device, amplitude dependent gain (AM/AM) and amplitude dependent phase shift (AM/PM) values for each accumulated sample.

2. The method of claim 1, wherein generating the accumulated sample further comprises down converting and filtering the plurality of samples for each particular pulse to determine the accumulated sample for the particular pulse.

3. The method of claim 1, wherein the at least one silence gap of the silence gaps is a different length than other silence gaps.

4. The method of claim 1, wherein at least one pulse includes a different number of samples than other pulses.

5. The method of claim 1, wherein lengths of the silence gaps, the interlaced pattern, a number, and amplitudes of the alternating higher and lower amplitude steps, and numbers of samples in the pulses are determined based on battery current consumption, calibration time, and error vector magnitude and spectral mask metrics.

6. The method of claim 1, further comprising computing correction values for calibration lookup table entries based on the computed AM/AM and AM/PM values.

7. The method of claim 6, wherein the interlaced pattern of alternating higher and lower amplitude steps consists of an identical number of the alternating higher and lower amplitude steps as a number of the calibration lookup table entries.

8. The method of claim 6, wherein the interlaced pattern of alternating higher and lower amplitude steps includes fewer amplitude steps than a number of the calibration lookup table entries and computing correction values further comprises interpolating additional AM/AM and AM/PM values for computing correction values from the computed AM/AM and AM/PM values.

9. The method of claim 8, wherein the interlaced pattern of alternating higher and lower amplitude steps consists of seven amplitude steps, the silence gaps between the seven amplitude steps have an identical length, and a number of samples in the plurality of samples of a particular pulse used to generate the accumulated sample for the particular pulse is identical for each pulse.

10. The method of claim 1, further comprising disabling a quadrature channel of the receiver circuitry.

11. A wireless communication device comprising:
transmission circuitry;
receiver circuitry coupled to the transmission circuitry by a feedback loop, the receiver circuitry to receive pulses transmitted by the transmission circuitry;
an accumulator component coupled the receiver circuitry to receive samples output by the receiver circuitry;
a processor coupled to the transmission circuitry and to the accumulator component; and
a non-transitory computer readable storage medium storing a program for digital predistortion (DPD) calibration for execution by the processor, the program including instructions to:
transmit, by the transmission circuitry, a plurality of pulses, wherein each particular pulse of the plurality of pulses to an amplitude step in an interlaced pattern of alternating higher and lower amplitude steps separated by silence gaps, wherein each of the alternating higher amplitude steps is higher than a previous higher amplitude step and each of the alternating lower amplitude steps is lower than a previous lower amplitude step, and wherein at least one silence gap of the silence gaps separates each of the alternating higher and lower amplitude steps;
receive each particular pulse in the receiver circuitry via the feedback loop;
generate, by the accumulator component, an accumulated sample for each particular pulse based on a plurality of samples output by the receiver circuitry for the particular pulse; and
compute amplitude dependent gain (AM/AM) and amplitude dependent phase shift (AM/PM) values for each accumulated sample.

12. The wireless communication device of claim 11, wherein the plurality of samples for each particular pulse is down converted and filtered by the accumulator component to determine the accumulated sample for the particular pulse.

13. The wireless communication device of claim 11, wherein the at least one silence gap of the silence gaps is a different length than other silence gaps.

14. The wireless communication device of claim 11, wherein at least one pulse includes a different number of samples than other pulses.

15. The wireless communication device of claim 11, wherein lengths of the silence gaps, the interlacedpattern, a number, and amplitudes of the alternating higher and lower amplitude steps, and numbers of samples in the pulses are determined based on battery current consumption, calibration time, and error vector magnitude and spectral mask metrics.

16. The wireless communication device of claim 11, wherein the instructions further include instructions to compute correction values for calibration lookup table entries based on the computed AM/AM and AM/PM values.

17. The wireless communication device of claim 16, wherein the interlaced pattern of alternating higher and lower amplitude steps consists of a same number of the alternating higher and lower amplitude steps as a number of the calibration lookup table entries.

18. The wireless communication device of claim 16, wherein the interlaced pattern of alternating higher and lower amplitude steps includes fewer amplitude steps than a number of the calibration lookup table entries and additional AM/AM and AM/PM values needed for computing correction values are interpolated from the computed AM/AM and AM/PM values.

19. The wireless communication device of claim 18, wherein the interlaced pattern of alternating higher and lower amplitude steps consists of seven amplitude steps, the silence gaps between the seven amplitude steps have an identical length, and a number of samples in the plurality of samples of a particular pulse used to generate the accumulated sample for the particular pulse is identical for each pulse.

20. The wireless communication device of claim 11, wherein a quadrature channel of the receiver circuitry is disabled during the DPD calibration.

\* \* \* \* \*